(12) United States Patent
Nakayama et al.

(10) Patent No.: US 8,665,415 B2
(45) Date of Patent: Mar. 4, 2014

(54) EXPOSURE APPARATUS AND DEVICE MANUFACTURING METHOD

(75) Inventors: Takahiro Nakayama, Utsunomiya (JP); Shigeru Terashima, Utsunomiya (JP); Yutaka Watanabe, Shioya-gun (JP)

(73) Assignee: Canon Kabushiki Kaisha (JP)

( * ) Notice: Subject to any disclaimer, the term of this patent is extended or adjusted under 35 U.S.C. 154(b) by 340 days.

(21) Appl. No.: 13/090,410

(22) Filed: Apr. 20, 2011

(65) Prior Publication Data

US 2011/0262866 A1 Oct. 27, 2011

(30) Foreign Application Priority Data

Apr. 23, 2010 (JP) ................................. 2010-100357
Feb. 7, 2011 (JP) ................................. 2011-024436

(51) Int. Cl.
*G03B 27/52* (2006.01)
*G03B 27/54* (2006.01)

(52) U.S. Cl.
USPC ............................................. 355/30; 355/67

(58) Field of Classification Search
CPC ........................................................ G03F 7/70
USPC ..................... 355/30, 53, 67, 77; 430/30, 311
See application file for complete search history.

(56) References Cited

U.S. PATENT DOCUMENTS

| | | | | |
|---|---|---|---|---|
| 6,268,904 B1* | 7/2001 | Mori et al. | ...................... | 355/53 |
| 6,385,290 B1* | 5/2002 | Kondo et al. | ................... | 378/84 |
| 6,961,113 B1* | 11/2005 | Hayashi et al. | ................. | 355/30 |
| 2003/0016780 A1* | 1/2003 | Matsuo et al. | ................... | 378/34 |
| 2004/0105080 A1* | 6/2004 | Teunissen et al. | ............... | 355/30 |
| 2005/0122492 A1* | 6/2005 | Hase | ............................... | 355/30 |
| 2008/0267815 A1* | 10/2008 | Morishima et al. | ............. | 422/24 |

FOREIGN PATENT DOCUMENTS

JP 2000-088999 A 3/2000

* cited by examiner

*Primary Examiner* — Toan Ton
*Assistant Examiner* — Colin Kreutzer
(74) *Attorney, Agent, or Firm* — Rossi, Kimms & McDowell LLP

(57) ABSTRACT

An exposure apparatus which projects exposure light from a pattern of an illuminated original onto a substrate, comprises a projection system including an optical element and configured to project the exposure light onto the substrate, an enclosure configured to enclose the projection system, and a cleaning mechanism configured to clean the optical element by irradiating the optical element with ultraviolet light under an environment in which oxygen is present within the enclosure, the cleaning mechanism including a light source configured to generate ultraviolet light, a tubular member including an exit window and configured to partially enclose an optical path between the light source and the optical element, and a regulating device configured to regulate an environment of a space inside the tubular member so that a partial pressure of oxygen becomes lower in the space inside the tubular member than in a space which is outside the tubular member.

9 Claims, 7 Drawing Sheets

F I G. 2C
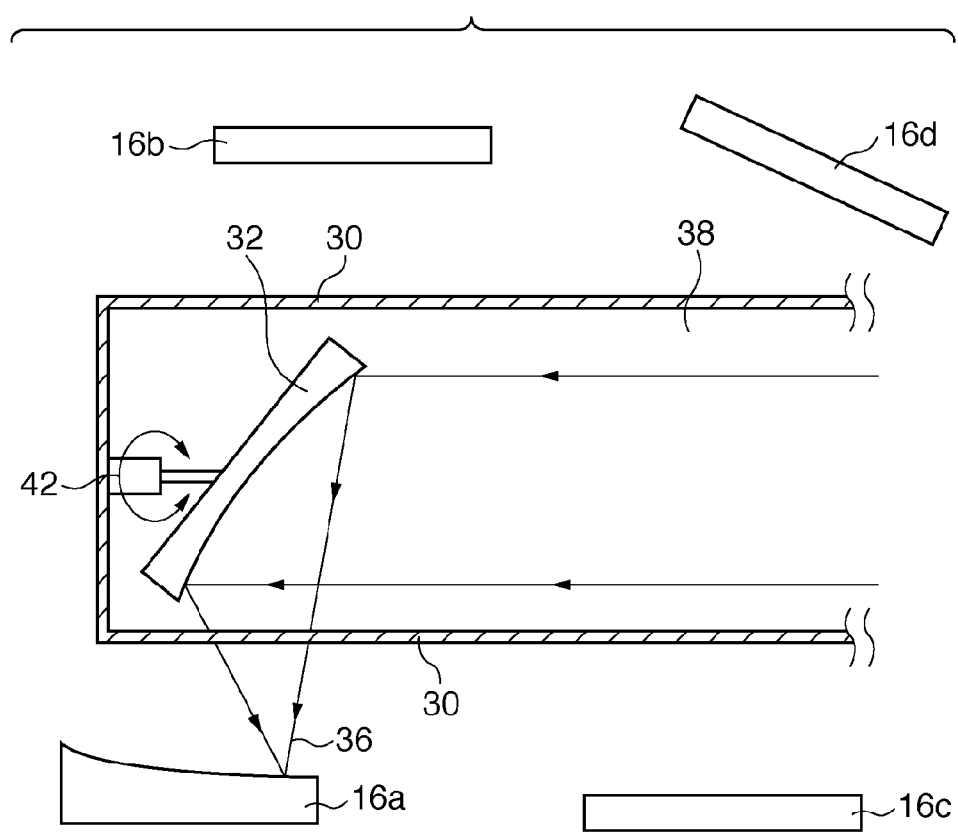

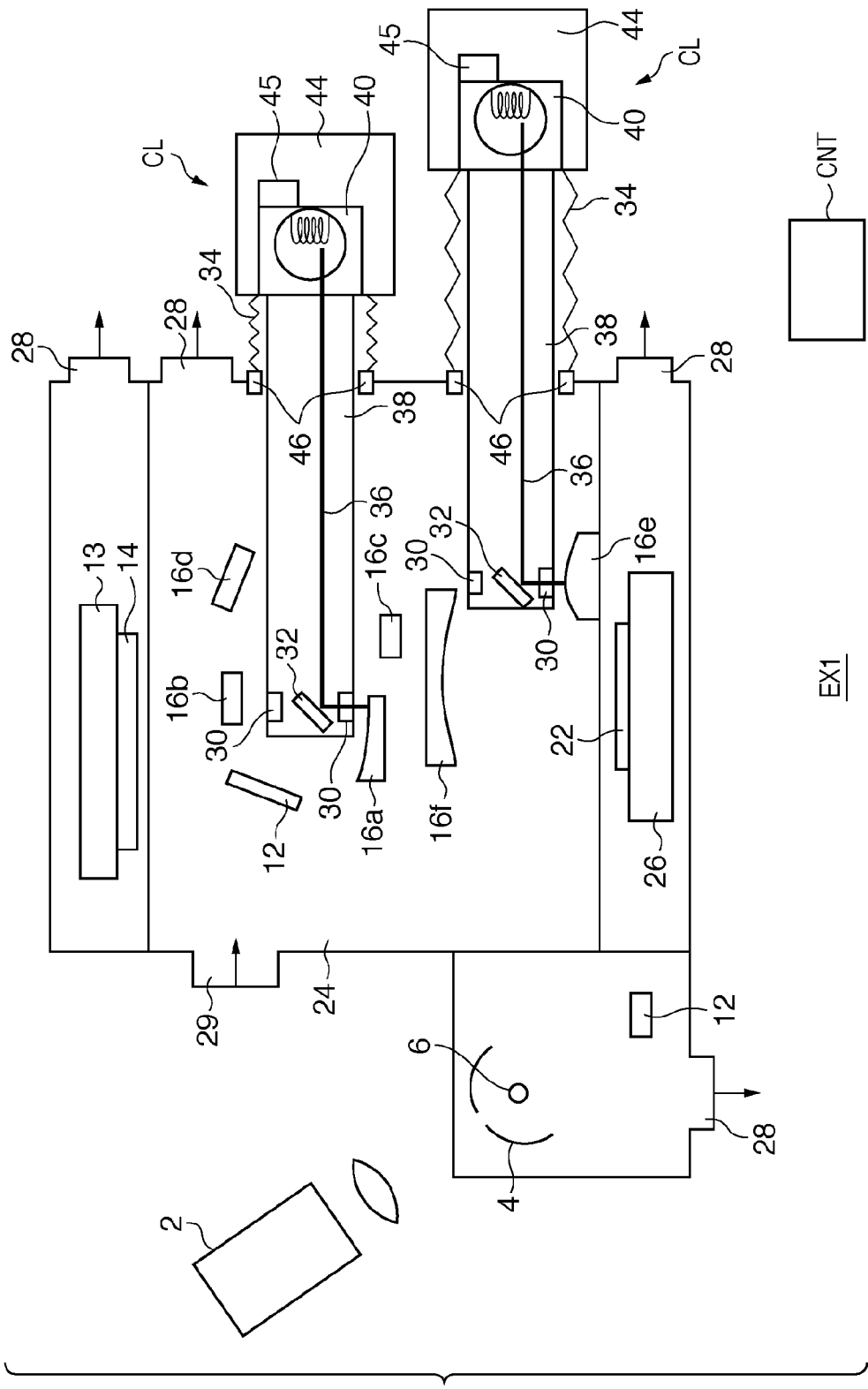

F I G. 5
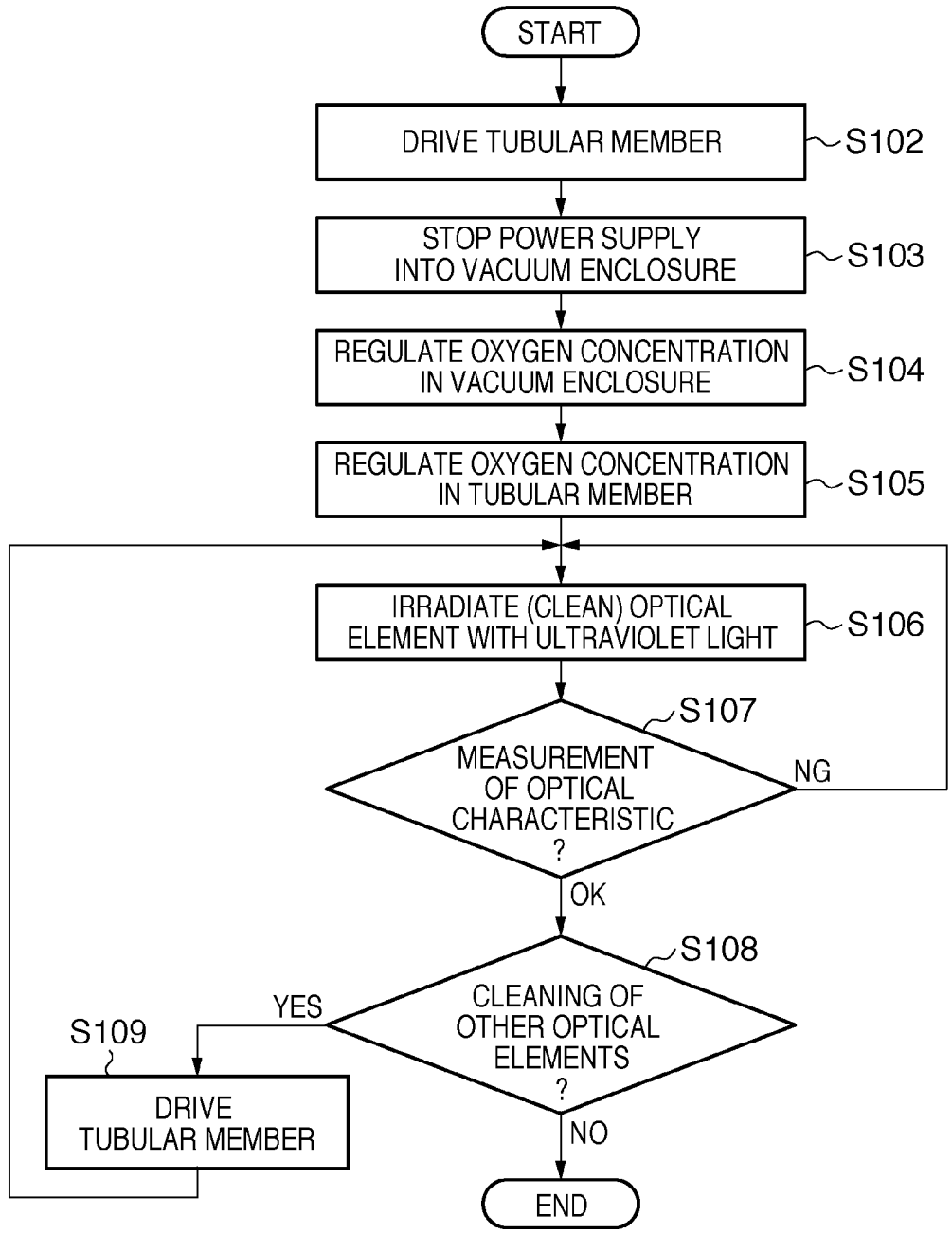

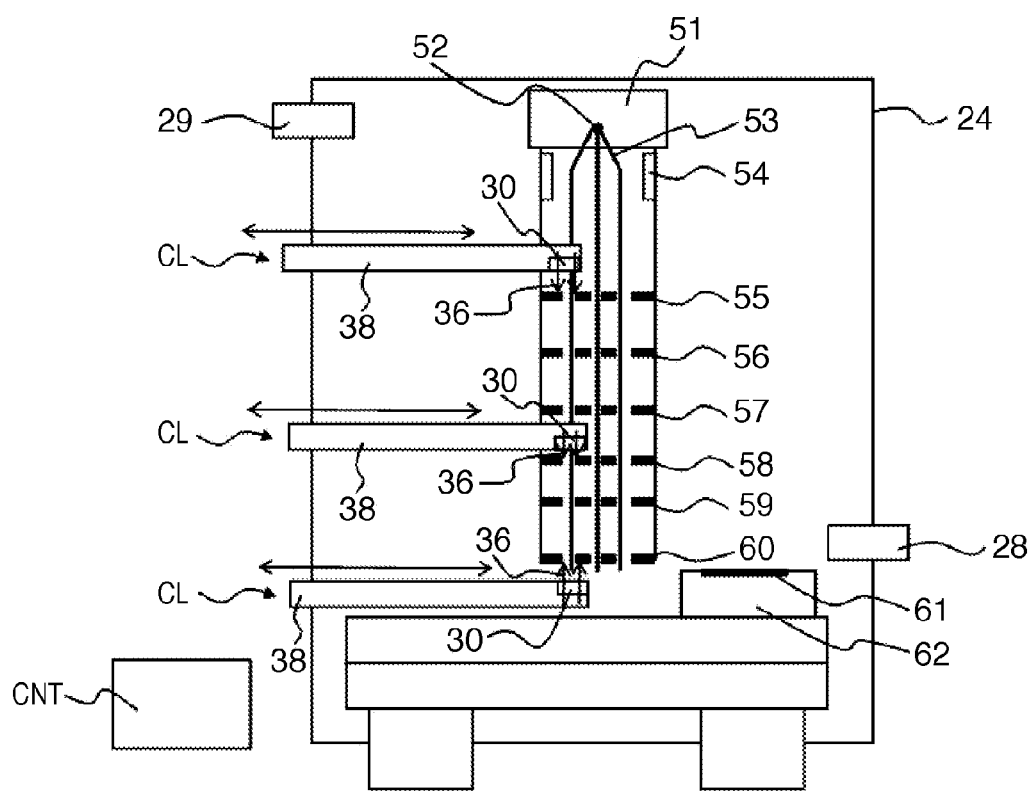
F I G. 6

EXPOSURE APPARATUS AND DEVICE MANUFACTURING METHOD

BACKGROUND OF THE INVENTION

1. Field of the Invention

The present invention relates to an exposure apparatus and a method of manufacturing a device using the exposure apparatus.

2. Description of the Related Art

An exposure apparatus is employed to manufacture a semiconductor integrated circuit having a fine pattern formed on it. The wavelength of light used in the exposure apparatus is shortened to keep up with pattern miniaturization. At present, various attempts are being made using soft X-rays. All substances have strong absorption in the soft X-ray wavelength range of 1 to 100 nm. Therefore, for this wavelength range, no practical transmissive optical element which uses refraction is available, unlike the visible light range, and an ultrathin-film filter or a reflector on which a multilayer film is formed is used as an optical element. For example, a multilayer mirror capable of obtaining a reflectance of about 70% as a normal-incidence reflectance has been fabricated for wavelengths around 11 nm and 13 nm, and an exposure apparatus including a reflective optical system having this multilayer mirror has been proposed. When a thin-film filter or a multilayer film is used, dust which adheres to its surface poses a serious problem because all substances have strong absorption in the soft X-ray range. Because soft X-rays are absorbed even by the air, the optical path must be evacuated to a vacuum. However, a very small amount of, for example, oil flows backward from a normal exhaust system, so carbon dust is formed on the surface of an optical element upon irradiation with soft X-rays in that state. This phenomenon is called carbon contamination. This decreases the transmittance or reflectance of the soft X-rays. In an exposure apparatus which uses soft X-rays, a wafer coated with a photosensitive polymer called a resist is loaded into a vacuum enclosure (vacuum chamber) in exposure, and a very small amount of gas generated by the resist may also produce carbon dust. A method which is most commonly used as a method of cleaning the substance surface is a wet cleaning method in which a treatment that uses a chemical solution and a rinse that uses pure water are combined. This cleaning method is very widely employed in, for example, a process of manufacturing a semiconductor integrated circuit, and minute adherent substances are removed by enhancing the purities and cleanliness levels of the chemical solution and pure water in that method. However, this method poses problems such as consumption of considerable amounts of chemical solution and pure water. In recent years, other cleaning methods such as a method of blowing minute water droplets at ultrafast speed, a method of irradiation with pulsed light, and a method of irradiation with radicals have also been proposed. When the adherent substances are, for example, organic compounds containing carbon as their major component, a method of removing adherent substances by irradiation with ultraviolet light in an atmosphere containing oxygen is also available (Japanese Patent Laid-Open No. 2000-88999). In this case, active oxygen is generated upon irradiating oxygen molecules with ultraviolet light, and reacts with carbon atoms in the adherent substances to form carbon dioxide, thereby removing the carbon dioxide.

In the conventional method, ultraviolet light is absorbed by oxygen in the atmosphere, so a sufficient removal rate cannot be obtained, thus requiring a long time to remove adherent substances. Prolongation of the time taken to remove adherent substances is undesirable because this increases the downtime of the exposure apparatus. For this reason, a demand has arisen for a technique that efficiently removes substances adhering to the surface of a soft X-ray optical element. Although a soft X-ray optical element has been described above, even adhesion of carbon onto other optical elements such as an optical element which uses ultraviolet light may also pose problems such as a decrease in reflectance or transmittance. In an exposure apparatus (a charged particle beam exposure apparatus or a charged particle beam drawing apparatus) which uses a charged particle beam as well, substances such as carbon may adhere to an optical element (an element which has the same effect on a charged particle beam as that exerted on a light beam by an optical element). The adhering substances may be charged and thereupon hinder appropriate exposure or drawing.

SUMMARY OF THE INVENTION

The present invention provides a technique that is advantageous in efficient removing of substances adhering to a surface of an optical element.

One of the aspects of the present invention provides an exposure apparatus which projects exposure light from a pattern of an illuminated original onto a substrate to expose the substrate to the exposure light, the apparatus comprising: a projection system including an optical element and configured to project the exposure light onto the substrate; an enclosure configured to enclose the projection system; and a cleaning mechanism configured to clean the optical element by irradiating the optical element with ultraviolet light under an environment in which oxygen is present within the enclosure, the cleaning mechanism including a light source configured to generate ultraviolet light, a tubular member including an exit window and configured to partially enclose an optical path between the light source and the optical element, and a regulating device configured to regulate an environment of a space inside the tubular member so that a partial pressure of oxygen becomes lower in the space inside the tubular member than in a space which is outside the tubular member and inside the enclosure, wherein the cleaning mechanism is configured to cause the ultraviolet light generated by the light source to pass through the tubular member, to exit the exit window, and to be incident on the optical element.

Further features of the present invention will become apparent from the following description of exemplary embodiments with reference to the attached drawings.

BRIEF DESCRIPTION OF THE DRAWINGS

FIG. 2C is a schematic view showing the vicinity of the exit window which outputs ultraviolet light;

FIG. 3 is a schematic configuration diagram of an exposure apparatus according to the second embodiment of the present invention;

FIG. 5 is a flowchart for explaining a cleaning method according to an embodiment of the present invention; and FIG. 6 is a schematic configuration diagram of an exposure apparatus according to the fourth embodiment of the present invention.

DESCRIPTION OF THE EMBODIMENTS

[First Embodiment]

Figure 1:
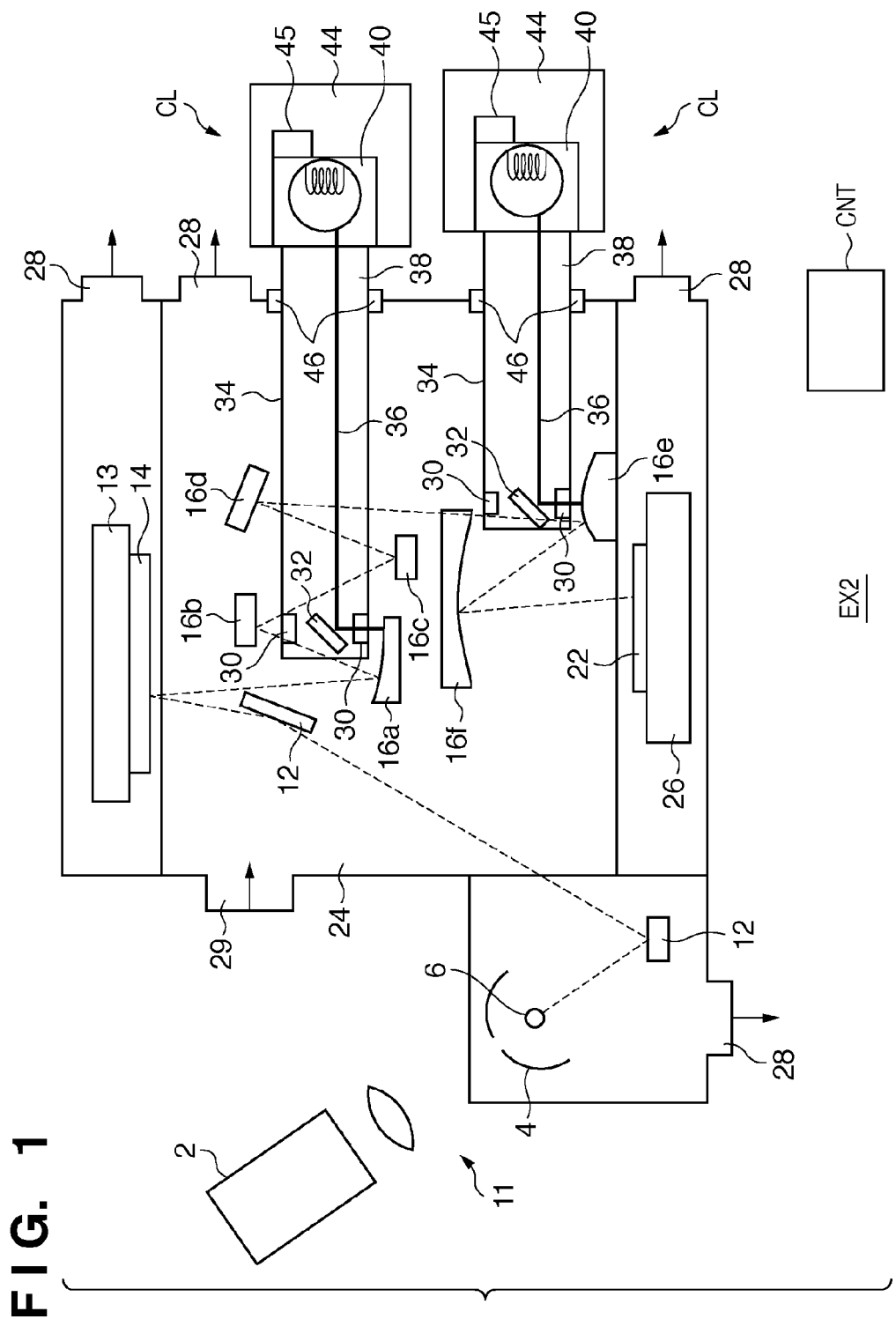
FIG. 1 is a schematic configuration diagram of an exposure apparatus according to the first embodiment of the present invention.

An exposure apparatus EX1 according to the first embodiment of the present invention will be described with reference to FIG. 1. Although the exposure apparatus EX1 serves as a soft X-ray reduction projection exposure apparatus, the exposure apparatus according to the present invention is not limited to this, and the present invention is applicable to all exposure apparatuses including optical elements to which substances may adhere. Referring to FIG. 1, reference numeral 2 denotes a laser; 4, a condensing mirror; 6, a light source point (light-emitting point); 11, a first light source; 12, a multilayer film reflector for an illumination system; 13, a reticle (original) stage; and 14, a reticle (original). Reference numeral 16a denotes a first multilayer film reflector for a projection system; 16b, a second multilayer film reflector for the projection system; 16c, a third multilayer film reflector for the projection system; 16d, a fourth multilayer film reflector for the projection system; 16e, a fifth multilayer film reflector for the projection system; and 16f, a sixth multilayer film reflector for the projection system. Reference numeral 22 denotes a wafer (substrate); 24, a vacuum enclosure (vacuum chamber); 26, a wafer (substrate) stage; 28, a gas exhaust port; and 29, a gas inlet port. Reference numeral 30 denotes an exit window; 32, an ultraviolet reflector; 36, ultraviolet light; 38, a tubular member (hollow light guide member); 40, a second light source unit; 44, a driving mechanism; 45, a regulating unit; 46, a seal; and CL, a cleaning mechanism.

The first light source 11 guides laser light from the laser 2 to the light source point (light-emitting point) 6 to generate soft X-rays (a soft X-ray beam or an extreme ultraviolet light beam) as exposure light (exposure beam). Note that the beam means a group of traveling (typically, traveling in a specific direction) waves (typically, waves which have short wavelengths and behave as if they were particles) or particles (typically, charged particles). The soft X-rays are focused by the condensing mirror 4, and illuminate the reticle 14, placed on the reticle stage 13, via the multilayer film reflector 12 which forms an illumination system. The soft X-rays reflected by the reticle 14 travel toward the first multilayer film reflector 16a which forms a projection system for reducing and projecting the pattern of the reticle 14. The soft X-rays form an image of the pattern of the reticle 14 on the wafer 22, placed on the wafer stage 26, via the first to sixth multilayer film reflectors 16a, 16b, 16c, 16d, 16e, and 16f which form the projection system. In other words, the pattern of the reticle 14 illuminated with the exposure light supplied from the first light source 11 is projected onto the wafer 22 by the projection system. The condensing mirror 4, the illumination system (multilayer film reflector 12), the reticle stage 13, the projection system (multilayer film reflectors 16a to 16f), and the wafer stage 26 are arranged in the vacuum enclosure 24. The vacuum enclosure 24 can be maintained at a pressure of 1 Pa or less by exhausting the gas in it via the exhaust port 28.

When the first to sixth multilayer film reflectors 16a to 16f are used over a long period of time, carbon dust particles are formed on the surfaces of the first to sixth multilayer film reflectors 16a to 16f by outgassing from members which constitute the exposure apparatus EX1 or by carbon compounds generated by the resist coated on the wafer 22. The carbon dust particles significantly decrease the reflectance of the soft X-rays. Hence, the first to sixth multilayer film reflectors 16a to 16f are irradiated with the ultraviolet light 36 under an environment in which oxygen is present, thereby cleaning their surfaces. This cleaning can be performed in accordance with a cleaning schedule or as needed. Alternatively, this cleaning may be performed the moment the value obtained by monitoring the amount of change in adherent substance or optical characteristic using a sensor (not shown) provided in the vacuum enclosure 24 reaches a predetermined value.

The exposure apparatus EX1 includes one or a plurality of cleaning mechanisms CL. The cleaning mechanism CL can include, for example, the second light source unit 40, the tubular member 38, the ultraviolet reflector 32, a driving mechanism 42 (see FIGS. 2A to 2C), and the driving mechanism 44. The second light source unit 40 emits ultraviolet light (cleaning light) with a wavelength different from that of light from the light source unit which emits exposure light. The tubular member 38 partially encloses the optical path between the second light source unit 40 and an optical element to be cleaned. Although the cross-sectional shape of the tubular member 38 is not limited to a specific shape, it can be, for example, a polygonal shape such as a quadrangular shape, a circular shape, or an elliptical shape. The ultraviolet reflector 32 reflects the ultraviolet light supplied from the second light source unit 40. The driving mechanisms 42 and 44 form a scanning mechanism which changes or scans the region to be irradiated with the ultraviolet light. The regulating unit 45 regulates the environment of the space inside the tubular member 38. In the example shown in FIG. 1, the exposure apparatus EX1 includes a cleaning mechanism CL which cleans the multilayer film reflectors 16a to 16d using ultraviolet light, and another cleaning mechanism CL which cleans the multilayer film reflectors 16e and 16f using ultraviolet light.

Figure 2A:
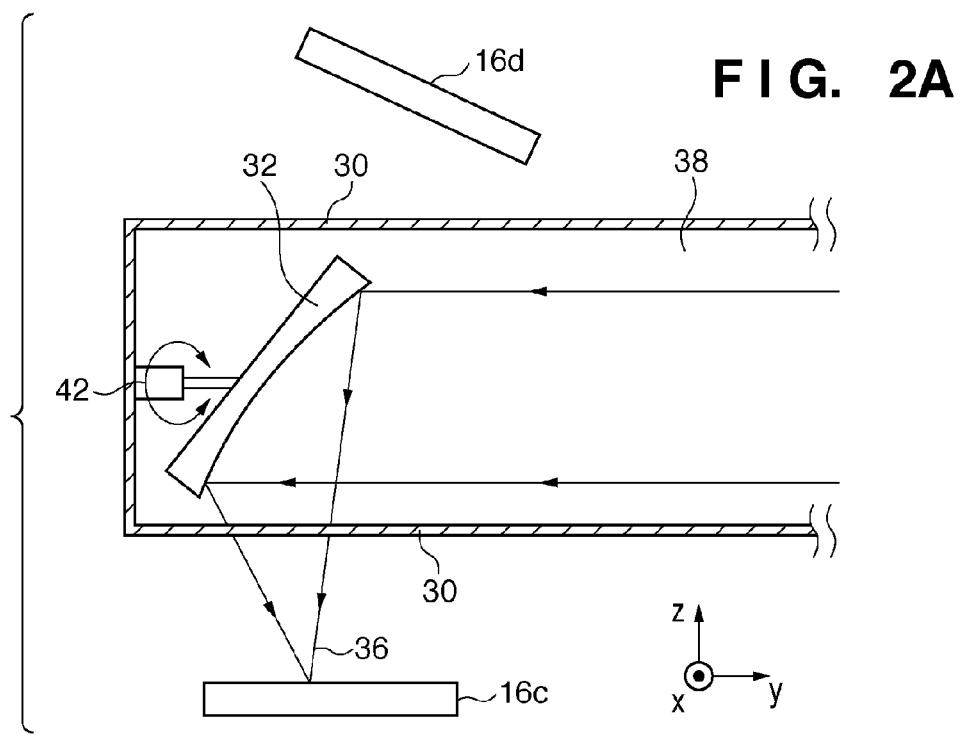
FIG. 2A is a schematic view showing the vicinity of an exit window which outputs ultraviolet light.
Figure 2B:
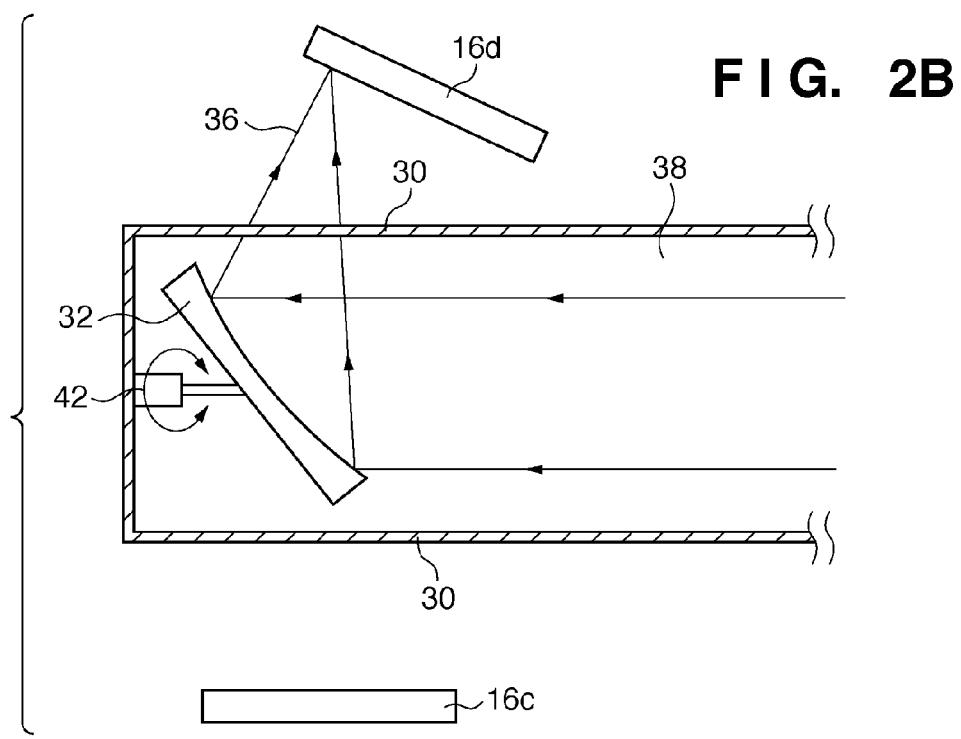
FIG. 2B is a schematic view showing the vicinity of the exit window which outputs ultraviolet light.

FIGS. 2A to 2C are views each showing the schematic arrangement of the distal end of the tubular member 38 in the cleaning mechanism CL which cleans the multilayer film reflectors 16a to 16d. Note that the cleaning mechanism CL which cleans the multilayer film reflectors 16e and 16f can have the same arrangement as the former cleaning mechanism CL. Referring to FIGS. 2A to 2C, reference numeral 42 denotes the driving mechanism. The ultraviolet light 36 is reflected and focused by the ultraviolet reflector 32. The ultraviolet light 36 reflected by the ultraviolet reflector 32 strikes the third multilayer film reflector 16c upon passing through the exit window 30. If an ultraviolet light (cleaning light) irradiation region on the third multilayer film reflector 16c is smaller than a soft X-ray (exposure light) irradiation region on the third multilayer film reflector 16c, the ultraviolet light must be scanned in order to clean the soft X-ray irradiation region. The ultraviolet reflector 32 can be rotated by the driving mechanism 42 to scan the ultraviolet light in the x-axis direction on the third multilayer film reflector 16c. That is, the ultraviolet reflector 32 and the driving mechanism 42 form one scanning mechanism which scans the ultraviolet light. By driving the tubular member 38 using the driving mechanism 44, the ultraviolet light can be scanned along the y-axis. That is, the driving mechanism 44 forms another scanning mechanism which scans the ultraviolet light. In this embodiment, the driving mechanisms 42 and 44 can two-dimensionally scan the ultraviolet light. Again in this embodiment, the driving mechanism 44 and the second light source unit 40 are disposed outside the vacuum enclosure 24, and the tubular member 38 extends through an opening provided in the wall of the vacuum enclosure 24. This opening is provided with the seal 46 which seals the gap between the tubular member 38 and the wall. The second light source unit 40 can have a function of changing the intensity of ultraviolet light to be emitted. The driving mechanism 44 and second light source unit 40 may be disposed in the vacuum enclosure 24.

Also, by rotating the ultraviolet reflector 32 through 180° using the driving mechanism 42, the fourth multilayer film reflector 16*d* can be irradiated with ultraviolet light and cleaned, as illustrated in FIG. 2B. Moreover, by driving the tubular member 38 using the driving mechanism 44, the ultraviolet reflector 32 can be set at the positions at which the first and second multilayer film reflectors 16*a* and 16*b* can be cleaned, as illustrated in FIG. 2C. The cleaning mechanism CL may include a zoom mechanism for changing the angle of convergence (or the focal point) of ultraviolet light. The angle of convergence can be changed in accordance with, for example, the distances from the exit window 30 to the multilayer film reflectors 16*a* to 16*d*. The angle of convergence may also be determined in accordance with the intensity of ultraviolet light, which is required for cleaning. Although ultraviolet light is converged by imparting a positive converging power to the ultraviolet reflector 32 in this embodiment, the power of the ultraviolet reflector 32 can be determined in accordance with, for example, the shape and arrangement of a reflector to be cleaned. The ultraviolet reflector 32 may be a plane mirror or have a negative diverging power.

FIG. 5 is a flowchart for explaining a cleaning process for an optical element in an exposure apparatus EX. A controller CNT included in the exposure apparatus EX can control this cleaning process. The controller CNT can start a cleaning process in accordance with, for example, a predetermined cleaning schedule. Alternatively, the controller CNT can start a cleaning process as needed in accordance with an instruction from the operator or a host control device. Also, the controller CNT can start a cleaning process the moment the amount of change in adherent substance or optical characteristic detected by the above-mentioned sensor reaches a predetermined value. In step S102, the controller CNT activates the driving mechanism 44 to position the tubular member 38 at the operation position at which an optical element to be cleaned (the multilayer film reflectors 16*a* to 16*f* in this case) in the vacuum enclosure 24 is cleaned.

In step S103, the controller CNT stops power supply to devices supplied with voltages equal to or higher than a predetermined voltage (for example, 100 V), among devices disposed in the vacuum enclosure 24. This prevents the occurrence of discharge in the vacuum enclosure 24 upon raising the pressure in the vacuum enclosure 24. Note that a Peltier device near the optical element, for example, is expected to become a discharge source.

In step S104, the controller CNT issues a command to an environment regulating unit (not shown) to regulate the environment in the vacuum enclosure 24 to the cleaning environment. An example of the cleaning environment is an environment in which the partial pressure of oxygen falls within the range of 100 (Pa) to 30,000 (Pa). The environment regulating unit (not shown), for example, supplies oxygen gas into the vacuum enclosure 24 via the gas inlet port 29 while monitoring the partial pressure of oxygen in the vacuum enclosure 24. Note that other oxygen-containing gases (for example, ozone gas) containing oxygen atoms may be used in place of oxygen gas. The oxygen-containing gases may contain other gases (for example, nitrogen) which poorly absorb ultraviolet light. Also, a valve (not shown) for isolating the space on the side of the light source (light-emitting point) 6 and that on the side of the projection system from each other may be provided so that this valve is closed before oxygen gas is supplied to the space on the side of the projection system in the vacuum enclosure 24.

In step S105, the controller CNT issues a command to the regulating unit 45 to regulate the internal environment of the tubular member 38 of the cleaning mechanism CL. The regulating unit 45 regulates the environment of the space inside the tubular member 38 so that the partial pressure of oxygen becomes lower in the space inside the tubular member 38 than in the space which is outside the tubular member 38 and inside the vacuum enclosure 24. This makes it possible to reduce attenuation of the ultraviolet light 36 when it passes through the space inside the tubular member 38, thus improving the efficiency of cleaning up carbon dust. The regulating unit 45 reduces the pressure in the tubular member 38 so that, for example, the partial pressure of oxygen within the tubular member 38 becomes lower than a predetermined value (for example, 10 (Pa)). To efficiently transmit the ultraviolet light 36 through the tubular member 38, the partial pressure of oxygen is preferably lower than 10 (Pa). Alternatively, the regulating unit 45 may supply a gas which poorly absorbs the ultraviolet light 36, such as nitrogen gas, into the tubular member 38. When a gas which poorly absorbs the ultraviolet light 36 is supplied into the tubular member 38, it may be supplied into the tubular member 38 so that the pressure in the tubular member 38 becomes equal to that in the vacuum enclosure 24 (that is, the pressure of the exterior of the tubular member 38). In this case, since the difference in pressure between the interior and exterior (the interior of the vacuum enclosure 24) of the tubular member 38 can be made small, the exit window 30 can have a relatively small thickness. This reduces absorption of the ultraviolet light 36 by the exit window 30, thus improving the use efficiency of the ultraviolet light 36.

In step S106, the controller CNT causes the cleaning mechanism CL to clean the optical element to be cleaned (one of the multilayer film reflectors 16*a* to 16*f* in this case). The cleaning mechanism CL uses the ultraviolet reflector 32 to reflect the ultraviolet light 36 emitted by the second light source unit 40 to irradiate the optical element to be cleaned with the ultraviolet light 36 via the exit window 30. Because the space inside the vacuum enclosure 24 is regulated to an environment in which oxygen gas (oxygen-containing gas) is present, active oxygen is generated upon irradiating the oxygen gas with the ultraviolet light 36, and reacts with carbon that acts as an adherent substance to form carbon dioxide. Thus, carbon dust is removed from the surface of the optical element. A device for removing ozone which may be generated upon irradiating the oxygen gas (oxygen-containing gas) with the ultraviolet light 36 can be disposed in the exhaust port 28.

In step S107, the controller CNT uses a sensor (not shown) provided in the vacuum enclosure 24 to measure the amount of change in adherent substance or optical characteristic. If the value indicating the adherent substance or optical characteristic detected by the sensor does not satisfy a tolerance, the controller CNT executes step S106 again; otherwise, the controller CNT advances the process to step S108. In step S108, the controller CNT determines whether other optical elements to be cleaned remain. If other optical elements to be cleaned remain, the controller CNT advances the process to step S109. In step S109, the controller CNT activates the driving mechanism 44 to position the tubular member 38 to the operation position at which an optical element to be cleaned is cleaned. After that, step S106 is executed for the optical element to be cleaned. If the controller CNT determines in step S108 that no more optical elements to be cleaned remain, it ends the cleaning process.

[Second Embodiment]

An exposure apparatus EX2 according to the second embodiment of the present invention will be described with reference to FIG. 3. The exposure apparatus EX2 in the second embodiment is different from the exposure apparatus EX1 in the first embodiment in that the former includes a bellows 34. The bellows 34 can be disposed between a driving mechanism 44 and the wall of a vacuum enclosure 24 so as to shield a tubular member 38 against the external environment of the vacuum enclosure 24.

[Third Embodiment]

Figure 4:
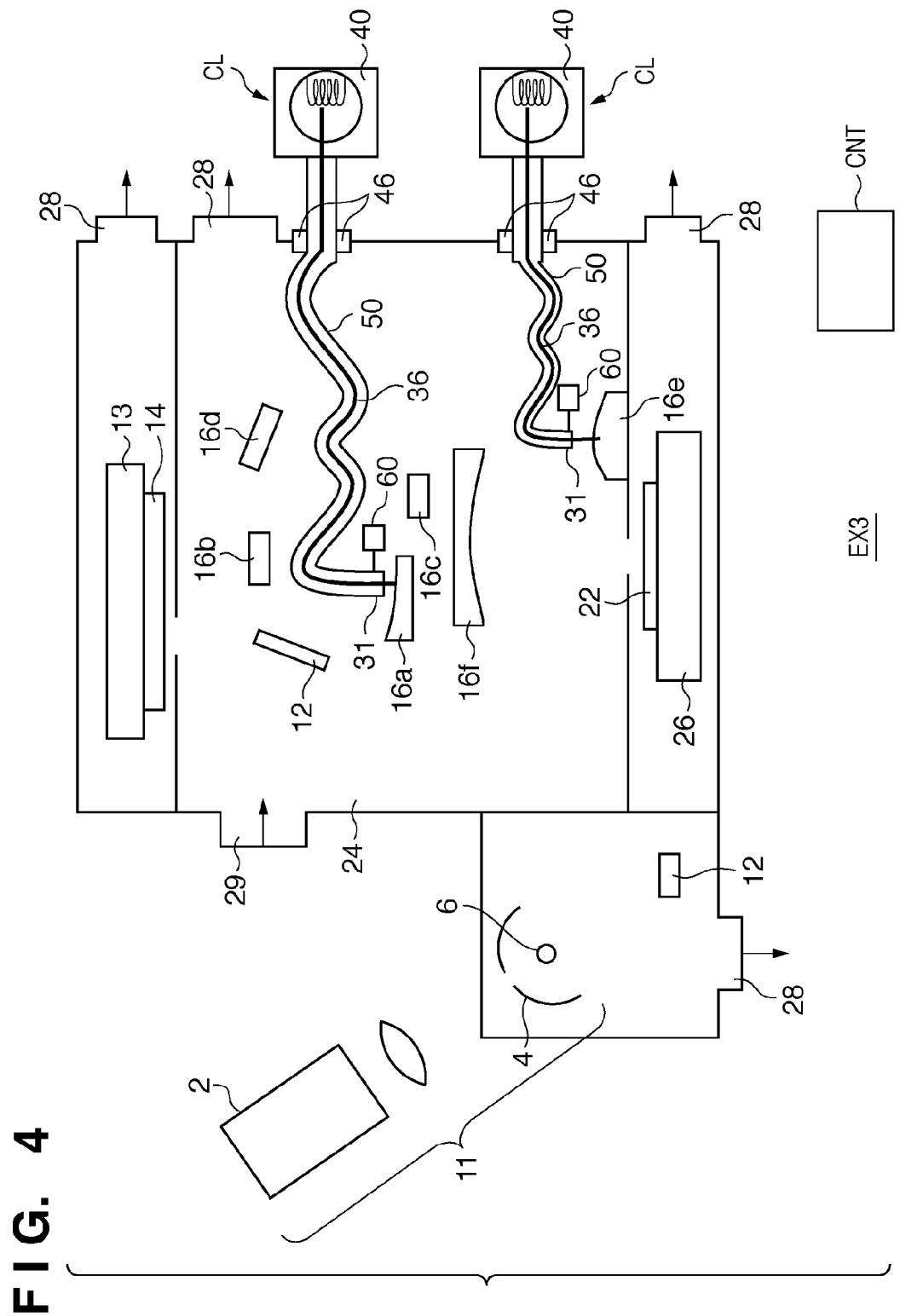
FIG. 4 is a schematic configuration diagram of an exposure apparatus according to the third embodiment of the present invention.

An exposure apparatus EX3 according to the third embodiment of the present invention will be described with reference to FIG. 4. The exposure apparatus EX3 in the third embodiment is different from the exposure apparatus EX1 in the first embodiment in that the former includes a solid light guide portion (that is, a light guide portion having a solid optical path for ultraviolet light (also referred to as a solid light guide member)) in place of the light guide member 38. A light guide portion 50 can be, for example, an optical fiber. The light guide portion 50 is disposed to guide ultraviolet light 36 up to the vicinities of first to sixth multilayer film reflectors 16a to 16f. Adoption of the light guide portion 50 makes it possible to solve the problem resulting from absorption of the ultraviolet light 36 by oxygen, thus improving the cleaning efficiency.

In the first and second embodiments, the ultraviolet light 36 passes through the space filled with an oxygen-containing gas within the tubular member 38, is reflected by the ultraviolet reflector 32, passes through the exit window 30, and strikes the first to sixth multilayer film reflectors 16a to 16f. In the third embodiment, the ultraviolet light 36 travels through the solid light guide portion (optical fiber) 50 while total reflection takes place, emerges from an exit portion 31 of the light guide portion 50, and strikes the first to sixth multilayer film reflectors 16a to 16f. The solid light guide portion 50 can be made a material such as $MgF_2$ which poorly absorbs ultraviolet light. Adoption of the solid light guide portion 50 with this structure makes it possible to reduce absorption of the ultraviolet light 36 by oxygen, thus irradiating the first to sixth multilayer film reflectors 16a to 16f with the ultraviolet light 36 at a high illuminance.

A cleaning mechanism CL in the third embodiment includes a driving mechanism 60 which drives the exit portion 31 so that the surfaces of the first to sixth multilayer film reflectors 16a are scanned by the ultraviolet light 36. The driving mechanism 60 can be configured to move the exit portion 31 into the path of an exposure beam and retract the exit portion 31 from this path. The driving mechanism 60 can be, for example, a robot having one or a plurality of joints. Also, the exit portion 31 may be configured to diverge and output the ultraviolet light or to locally converge the ultraviolet light. Note that the exposure apparatus EX3 may include a single or a plurality of cleaning mechanisms CL. If the exposure apparatus EX3 includes a single cleaning mechanism CL, the driving mechanism 60 which drives the exit portion 31 can be configured such that the single cleaning mechanism CL can clean the first to sixth multilayer film reflectors 16a to 16f. If the exposure apparatus EX3 includes a plurality of cleaning mechanisms CL, the driving mechanism 60 which drives the exit portion 31 can be configured such that each cleaning mechanism CL can clean an exclusive optical element. According to the third embodiment, a mechanism which guides ultraviolet light is simple, and there is no need to regulate the environment of the optical path of ultraviolet light.

[Fourth Embodiment]

FIG. 6 is a schematic diagram showing a charged particle beam exposure apparatus (charged particle beam drawing apparatus) according to the fourth embodiment. Although an example in which an electron beam is used as a charged particle beam will be described hereinafter, other charged particle beams such as an ion beam may be used. Referring to FIG. 6, an electron gun 51 forms a crossover image 52. An electron beam 53 which diverges from the crossover image 52 is converted into a collimated beam by the action of a collimator lens 54, and enters an aperture array 55 which forms a multi-electron beam optical system. The aperture array 55 has a plurality of circular apertures arrayed in a matrix pattern, and the incident electron beam 53 is split into a plurality of electron beams. The electron beams having passed through the aperture array 55 enter an electrostatic lens array 56 including three electrode plates (three electrode plates are shown as a single member in FIG. 6) having circular apertures. A stopping aperture array 58 in which small apertures are arranged in a matrix pattern is disposed at the position at which the electron beams having passed through the electrostatic lens array 56 form a first crossover image. A blanker array 57 executes a blanking operation which uses the stopping aperture array 58. The electron beams having passed through the stopping aperture array 58 form an image of original crossover 2 on a sample 61 such as a wafer or a mask by means of a second electrostatic lens array 60. During pattern drawing, the sample 61 continuously moves in the X direction by means of a sample stage 62, so the image on the surface of the sample 61 is deflected in the Y direction by a deflector 59 with reference to the real-time length measurement result obtained by a laser length measuring machine, and is blanked by the blanker array 57. With the above-mentioned operation, a desired latent image can be formed on the resist. These constituent elements are arranged inside a vacuum enclosure 24. Also, an electron beam exposure apparatus includes an exhaust mechanism such as a vacuum pump, and exhausts the vacuum enclosure 24 via an exhaust port 28 to form a vacuum environment (a pressure of, for example, $1 \times 10^{-5}$ Pa or less) in the vacuum enclosure 24. Because especially an electron lens portion requires a high degree of vacuum, this portion is often provided with an independent exhaust system separately from a sample stage portion which generates a large amount of gas.

In this electron beam exposure apparatus, contaminants adhere to an optical unit including the collimator lens 54, aperture array 55, electrostatic lens array 56, blanker array 57, stopping aperture array 58, deflector 59, and second electrostatic lens array 60. Such contaminants include, for example, carbon and are produced by outgassing from members which constitute the electron beam exposure apparatus or carbon compounds released from the resist (photosensitive agent) coated on the sample. These carbon compounds are adsorbed into the surface of the optical unit, bring about photochemical reactions (radiation-chemical reactions) upon irradiation with an electron beam, and adhere to the surface of the optical unit as carbon. These contaminants are positively or negatively charged upon irradiation with the electron beam 53 or secondary electrons or reflected electrons generated by the electron beam 53, and apply an attractive or repulsive force to electrons in the electron beam 53, so the electrons in the electron beam 53 deviate from a desired trajectory. This poses a problem that a desired pattern cannot be obtained. Because especially the second electrostatic lens array 60 close to the resist is strongly influenced by carbon compounds released from the resist, contaminants are more likely to adhere to it as carbon compounds released from the resist upon exposing the sample 61 and simultaneously generated secondary electrons react with each other.

In this embodiment, the electron beam exposure apparatus includes cleaning mechanisms CL, which supply ultraviolet rays generated by cleaning devices to the optical unit while an oxidizing gas is introduced in the electron beam exposure apparatus in cleaning. As a result, active species generated by irradiating the oxidizing gas adsorbed into a portion to be cleaned with the ultraviolet rays react with contaminants, thereby removing the contaminants. A case in which oxygen is used as an oxidizing gas will be described as an exemplary example herein. Note that ozone or a gas containing water vapor can also be used as an oxidizing gas in place of oxygen.

The current value of the electron beam 53 is measured using a sensor (a detector; not shown). When a current value different from a predetermined value is detected, it is determined that contaminants have adhered to the optical unit, and cleaning is started. At the start of cleaning, application of a high voltage to the optical unit is stopped first. This prevents the occurrence of discharge in the optical unit upon introducing oxygen into the vacuum enclosure 24. After power supply to the optical unit is completed, oxygen is introduced from a gas inlet port 29. Oxygen is introduced such that, for example, the partial pressure of oxygen falls within the range of 100 (Pa) to 30,000 (Pa).

A controller CNT issues a command to a regulating unit 45 (see FIG. 1; not shown) to regulate the internal environment of a light guide member (also referred to as a tubular member or a solid light guide member) 38 in the cleaning mechanism CL. The regulating unit 45 regulates the environment of the space inside the light guide member 38 so that the partial pressure of oxygen becomes lower in the space inside the light guide member 38 than in the space which is outside the light guide member 38 and inside the vacuum enclosure 24. The regulating unit 45 reduces the pressure in the light guide member 38 so that, for example, the partial pressure of oxygen within the light guide member 38 becomes lower than a predetermined value. To efficiently transmit ultraviolet light 36 through the light guide member 38, the partial pressure of oxygen is preferably lower than 10 (Pa). Alternatively, the regulating unit 45 supplies a gas which poorly absorbs the ultraviolet light 36, such as nitrogen gas, into the light guide member 38. When a gas which poorly absorbs the ultraviolet light 36 is supplied into the light guide member 38, it is supplied into the light guide member 38 so that the pressure in the light guide member 38 becomes equal to that in the vacuum enclosure 24 (that is, the pressure of the exterior of the light guide member 38). At this time, the partial pressure of oxygen can be set to 10 Pa or less by filling the interior of the light guide member 38 with nitrogen having a purity of 99.99% or more. In this case, since the difference in pressure between the interior and exterior (the interior of the vacuum enclosure 24) of the light guide member 38 can be made small, an exit window 30 can have a relatively small thickness. This reduces absorption of the ultraviolet light 36 by the exit window 30, thus improving the use efficiency of the ultraviolet light 36. In this manner, reducing the pressure in the light guide member 38 or filling the interior of the light guide member 38 with an ultraviolet-transmitting gas makes it possible to reduce attenuation of the ultraviolet light 36 when it passes through the space inside the light guide member 38, thus improving the efficiency of cleaning up carbon dust.

Next, the cleaning mechanisms CL are inserted into the optical path of the electron beam 53 to move exit windows 30 to the vicinities of optical elements. FIG. 6 illustrates an example in which the cleaning mechanisms CL are moved to the vicinities of the aperture array 55, stopping aperture array 58, and second electrostatic lens array 60. A method of cleaning the second electrostatic lens array 60 will be described herein as an example. The second electrostatic lens array 60 includes a plurality of optical elements to control the electron beams 53 split by the aperture array 55. In cleaning the second electrostatic lens array 60 by irradiation with the ultraviolet light 36, the distance between the second electrostatic lens array 60 and the cleaning mechanism CL is so short that the ultraviolet light 36 cannot impinge on a wide range at once. Hence, the second electrostatic lens array 60 is irradiated with the ultraviolet light 36 more than once. After the second electrostatic lens array 60 is irradiated with the ultraviolet light 36 for a predetermined time at the first position, it is irradiated with the ultraviolet light 36 upon movement to the next irradiation position. Thus, all optical elements included in the second electrostatic lens array 60 are cleaned. By scanning the ultraviolet light 36 on the second electrostatic lens array 60 using a reflector 32 and driving mechanism 42 (see FIG. 2; not shown) within the light guide member 38, a plurality of optical elements can be cleaned at a single point. This allows more efficient cleaning. After the cleaning, a sensor (not shown) is irradiated with the electron beam 53 to check whether a desired optical characteristic is restored, thereby determining whether contaminant removal is complete. When contaminants have thoroughly been removed, the cleaning mechanisms CL are retracted from the path of the electron beam 53, the supply of oxygen gas from the gas inlet port 29 is stopped, and the cleaning is ended. Although a plurality of cleaning mechanisms CL are provided as an exemplary example in this embodiment, an excellent effect can also be produced even when a cleaning mechanism CL is provided in the vicinity of either the stopping aperture array 58 or the second electrostatic lens array 60.

According to this embodiment, a plurality of optical elements can be cleaned using a single cleaning mechanism CL. Hence, a wide range can be cleaned even in an electron beam exposure apparatus having only a small space into which the cleaning mechanism CL can be inserted, thus allowing efficient cleaning.

[Other Embodiments]

The present invention is applicable to an exposure apparatus which has a projection system including a reflective optical element (reflector) and an exposure apparatus (drawing apparatus) which has a projection system including an optical element (an element which has the same effect on a charged particle beam as that exerted on a light beam by an optical element), as mentioned above. The present invention is also applicable to an exposure apparatus which has a projection system including a transmissive optical element. When carbon dust adheres to the surface of the transmissive optical element, its transmittance decreases. Therefore, even in an exposure apparatus which has a projection system including a transmissive optical element, it is effective to form a cleaning mechanism so as to remove carbon dust on the surface of the transmissive optical element. A projection system including a transmissive optical element is disposed in an enclosure. The enclosure may be maintained in an atmospheric-pressure air atmosphere, in an atmosphere other than an air atmosphere, in a reduced-pressure environment, or in a vacuum environment.

[Device Manufacturing Method]

A device manufacturing method according to an embodiment of the present invention is suitable for manufacturing devices such as a semiconductor device and a liquid crystal device. This method can include a step of exposing a substrate coated with a photosensitive agent using the above-mentioned exposure apparatus, and a step of developing the exposed substrate. This method can moreover include subsequent known steps (for example, oxidation, film formation, vapor deposition, doping, planarization, etching, resist removal, dicing, bonding, and packaging).

Although several embodiments of the present invention have been described above, the present invention is not limited to these embodiments, and various modifications and changes can be made without departing from the scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-100357 filed Apr. 23, 2010 and No. 2011-024436 filed Feb. 7, 2011, which are hereby incorporated by reference herein in their entirety.

What is claimed is:

1. An exposure apparatus for exposing a substrate using an exposure beam, the apparatus comprising:
   a projection system, including an optical element, configured to project the exposure beam onto the substrate;
   an enclosure configured to enclose the projection system; and
   a cleaning mechanism configured to clean the optical element by irradiating the optical element with an ultraviolet beam under an environment in which oxygen is present within the enclosure,
   wherein the cleaning mechanism includes:
   a tubular member, including an exit window, configured to enclose at least part of an optical path between the optical element and a source that generates the ultraviolet beam;
   a driving mechanism configured to drive the tubular member between a position on an optical path of the exposure beam and a position outside the optical path of the exposure beam; and
   a regulating device configured to regulate an environment of an internal space of the tubular member so that a partial pressure of oxygen becomes lower in the internal space than in an external space of the tubular member,
   wherein the cleaning mechanism is configured to cause the ultraviolet beam that passes through the internal space of the tubular member, the environment of the internal space having been regulated by the regulating device, to be incident on the optical element via the exit window of the tubular member, the tubular member having been driven to the position on the optical path of the exposure beam by the driving mechanism.

2. The apparatus according to claim 1, wherein the cleaning mechanism further includes a scanning mechanism configured to scan the optical element with the ultraviolet beam.

3. The apparatus according to claim 2, wherein the scanning mechanism includes:
   a reflector disposed on an optical path of the ultraviolet beam in the tubular member and configured to reflect the ultraviolet beam; and
   a reflector driving mechanism configured to drive the reflector to scan the optical element with the ultraviolet beam.

4. The apparatus according to claim 1, wherein:
   the projection system includes a plurality of optical elements, and
   the cleaning mechanism is configured to clean the plurality of optical elements in turn.

5. The apparatus according to claim 1, wherein:
   the source that generates the ultraviolet beam is disposed outside the enclosure, and
   the tubular member extends through an opening provided in a wall of the enclosure.

6. The apparatus according to claim 1, wherein the exposure beam is one of a soft X-ray beam or a charged particle beam.

7. The apparatus according to claim 1, wherein the exposure beam has a wavelength different from that of the ultraviolet beam.

8. The apparatus according to claim 1, wherein the exposure beam is an extreme ultraviolet beam.

9. A method of manufacturing a device, the method comprising:
   exposing a substrate using an exposure apparatus; and
   developing the exposed substrate; and
   processing the developed substrate to manufacture the device,
   wherein the exposure apparatus is configured to expose the substrate using an exposure beam and comprises:
   a projection system, including an optical element, configured to project the exposure beam onto the substrate;
   an enclosure configured to enclose the projection system; and
   a cleaning mechanism configured to clean the optical element by irradiating the optical element with an ultraviolet beam under an environment in which oxygen is present within the enclosure,
   wherein the cleaning mechanism includes:
   a tubular member, including an exit window, configured to enclose at least part of an optical path between the optical element and a source that generates the ultraviolet beam;
   a driving mechanism configured to drive the tubular member between a position on an optical path of the exposure beam and a position outside the optical path of the exposure beam; and
   a regulating device configured to regulate an environment of an internal space of the tubular member so that a partial pressure of oxygen becomes lower in the internal space than in an external space of the tubular member,
   wherein the cleaning mechanism is configured to cause the ultraviolet beam that passes through the internal space of the tubular member, the environment of the internal space having been regulated by the regulating device, to be incident on the optical element via the exit window of the tubular member, the tubular member having been driven to the position on the optical path of the exposure beam by the driving mechanism.

* * * * *